United States Patent
Nakaiso et al.

(10) Patent No.: US 9,824,955 B2
(45) Date of Patent: Nov. 21, 2017

(54) SEMICONDUCTOR DEVICE

(71) Applicant: Murata Manufacturing Co., Ltd., Nagaokakyo-shi, Kyoto-fu (JP)

(72) Inventors: Toshiyuki Nakaiso, Nagaokakyo (JP); Noboru Kato, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/427,195

(22) Filed: Feb. 8, 2017

(65) Prior Publication Data

US 2017/0148707 A1    May 25, 2017

Related U.S. Application Data

(63) Continuation of application No. 14/837,153, filed on Aug. 27, 2015, now Pat. No. 9,607,976, which is a (Continued)

(30) Foreign Application Priority Data

Feb. 28, 2013  (JP) .................................. 2013-039379
Apr. 5, 2013  (JP) .................................. 2013-079960

(51) Int. Cl.
*H01L 23/48*  (2006.01)
*H01L 23/485*  (2006.01)
(Continued)

(52) U.S. Cl.
CPC ........ *H01L 23/485* (2013.01); *H01L 23/4824* (2013.01); *H01L 23/4827* (2013.01); (Continued)

(58) Field of Classification Search
CPC ... H01L 23/485; H01L 24/05; H01L 23/4824; H01L 27/0292; H01L 23/4827; H01L 27/0255
See application file for complete search history.

(56) References Cited

U.S. PATENT DOCUMENTS 5,311,042 A  5/1994 Anceau
5,416,358 A  5/1995 Ochi et al.
(Continued)

FOREIGN PATENT DOCUMENTS

GB  2525774 A  11/2015
JP  H04-17375 A  1/1992
(Continued)

OTHER PUBLICATIONS

International Search Report issued for PCT/JP2014/054404, dated May 27, 2014.
(Continued)

*Primary Examiner* — William Coleman
(74) *Attorney, Agent, or Firm* — Arent Fox LLP

(57) ABSTRACT

An ESD protection device including a Si substrate with an ESD protection circuit formed at the surface of the substrate; pads formed on the Si substrate; a rewiring layer opposed to the surface of the Si substrate, which includes terminal electrodes electrically connected to the pads. The rewiring layer includes a SiN protection film formed on the surface of the Si substrate to cover parts of the pads except regions in contact with openings (contact holes) formed in a resin layer, and the resin layer that is lower in dielectric constant than the SiN protection film, and formed between the SiN protection film and the terminal electrodes. Thus, provided is a semiconductor device which can reduce the generation of parasitic capacitance, and eliminates variation in parasitic capacitance generated.

18 Claims, 17 Drawing Sheets

Related U.S. Application Data continuation of application No. PCT/JP2014/054406, filed on Feb. 25, 2014.

(51) Int. Cl.
*H01L 27/02* (2006.01)
*H01L 23/482* (2006.01)
*H01L 23/00* (2006.01)

(52) U.S. Cl.
CPC .......... *H01L 24/05* (2013.01); *H01L 27/0255* (2013.01); *H01L 27/0292* (2013.01); *H01L 2224/024* (2013.01); *H01L 2224/02331* (2013.01); *H01L 2224/02379* (2013.01); *H01L 2224/02381* (2013.01); *H01L 2224/05548* (2013.01); *H01L 2924/0504* (2013.01)

(56) References Cited

U.S. PATENT DOCUMENTS

| | | |
|---|---|---|
| 6,853,089 B2 | 2/2005 | Ujiie et al. |
| 7,285,867 B2 | 10/2007 | Matsuzaki et al. |
| 7,579,632 B2 | 8/2009 | Salih et al. |
| 8,456,856 B2 | 6/2013 | Lin |
| 8,558,383 B2 | 10/2013 | Lin |
| 8,710,645 B2 | 4/2014 | Shau |
| 2003/0052419 A1 | 3/2003 | Ujiie et al. |
| 2004/0016971 A1 | 1/2004 | Abe et al. |
| 2004/0197959 A1 | 10/2004 | Ujiie et al. |
| 2005/0006760 A1 | 1/2005 | Terui |
| 2007/0073807 A1 | 3/2007 | Bobde |
| 2007/0086129 A1 | 4/2007 | Vos et al. |
| 2007/0210317 A1 | 9/2007 | Chou et al. |
| 2008/0121988 A1 | 5/2008 | Mallikararjunaswamy et al. |
| 2008/0265421 A1 | 10/2008 | Brunnbauer et al. |
| 2009/0079001 A1 | 3/2009 | Salih et al. |
| 2010/0155962 A1 | 6/2010 | Inoue |
| 2010/0301459 A1 | 12/2010 | Akiba et al. |
| 2010/0314660 A1 | 12/2010 | Salih et al. |
| 2011/0309472 A1 | 12/2011 | Nakaiso |
| 2012/0068299 A1 | 3/2012 | Lin |
| 2012/0326207 A1 | 12/2012 | Yoshimochi |
| 2013/0099353 A1 | 4/2013 | Kato et al. |
| 2013/0168837 A1 | 7/2013 | Kato et al. |
| 2014/0332937 A1 | 11/2014 | Brunnbauer et al. |
| 2015/0371984 A1 | 12/2015 | Kato et al. |

FOREIGN PATENT DOCUMENTS

| | | |
|---|---|---|
| JP | H05-218459 A | 8/1993 |
| JP | H05-268123 A | 10/1993 |
| JP | H11-54708 A | 2/1999 |
| JP | 2002-176106 A | 6/2002 |
| JP | 2002-252309 A | 9/2002 |
| JP | 2002270720 A | 9/2002 |
| JP | 2003-092374 A | 3/2003 |
| JP | 2003-124222 A | 4/2003 |
| JP | 2004-119870 A | 4/2004 |
| JP | 2004-158758 A | 6/2004 |
| JP | 2004-281898 A | 10/2004 |
| JP | 2005-032782 A | 2/2005 |
| JP | 2005-340573 A | 12/2005 |
| JP | 2006049511 A | 2/2006 |
| JP | 2006173476 A | 6/2006 |
| JP | 2007-123538 A | 5/2007 |
| JP | 2006141136 A | 6/2008 |
| JP | 2006-277742 A | 11/2008 |
| JP | 2009-016882 A | 1/2009 |
| JP | 2009515323 A | 4/2009 |
| JP | 2010-087113 A | 4/2010 |
| JP | 2010-512003 A | 4/2010 |
| JP | 2016-510662 A | 4/2010 |
| JP | 2010-278040 A | 12/2010 |
| JP | 2012-146717 A | 6/2012 |
| JP | 2012-182381 A | 9/2012 |
| WO | WO 2011/152255 A1 | 12/2011 |
| WO | WO 2012/023394 A1 | 2/2012 |
| WO | WO 2014-132938 A1 | 9/2014 |
| WO | WO 2014162795 A1 | 10/2014 |

OTHER PUBLICATIONS

International Search Report issued for PCT/JP2014/054406, dated May 27, 2014.
International Search Report issued for PCT/JP2014/054407, dated May 27, 2014.
Written Opinion of the International Search Authority for PCT/JP2014/054403, dated May 27, 2014.
Written Opinion of the International Searching Authority for PCT/JP2014/054406, dated May 27, 2014.
Written Opinion of the International Searching Authority issued for PCT/JP2014/054404, dated May 27, 2014.
Written Opinion of the International Searching Authority issued for PCT/JP2014/054407, dated May 27, 2014.
International Search Report issued for PCT/JP2014/054403, dated May 27, 2014.

SEMICONDUCTOR DEVICE

CROSS REFERENCE TO RELATED APPLICATIONS

The present application is a continuation of U.S. application Ser. No. 14/837,153, filed Aug. 27, 2015, which is a continuation of PCT/JP2014/054406 filed Feb. 25, 2014, which claims priority to JP Application No. 2013-079960, filed Apr. 5, 2013, and JP Application No. 2013-039379, filed Feb. 28, 2013, the entire contents of each of which are incorporated herein by reference.

FIELD OF THE INVENTION

The present invention relates to a semiconductor device including a rewiring layer on a semiconductor substrate with a functional element formed.

BACKGROUND OF THE INVENTION

An ESD (Electro-Static-Discharge) protection device as a type of semiconductor devices. The ESD protection device protects semiconductor ICs, etc. from static electricity, etc. Various electronic devices including mobile communication terminals, digital cameras, and laptop PCs are provided with semiconductor integrated circuits constituting logic circuits, memory circuits, etc. Such semiconductor integrated circuits are low-voltage drive circuits composed of micro wiring patterns formed on semiconductor substrates, and thus generally fragile against electrostatic discharge such as surge. Therefore, ESD protection devices are used for protecting such semiconductor integrated circuits from surge.

When an ESD protection device is provided in a high-frequency circuit, there is the problem of being affected by parasitic capacitance of a diode. More specifically, the insertion of the ESD device into the signal line shifts impedance under the influence of the parasitic capacitance of the diode, and as a result, loss of signal may be caused. In particular, ESD protection devices for use in high-frequency circuits are required to be low in parasitic capacitance, in order not to decrease high-frequency characteristics of signal lines connected or integrated circuits to be protected. Thus, Patent Document 1 discloses an ESD protection device with circuit characteristic degradation suppressed by reducing the influence of the parasitic capacitance of a diode.

Patent Document 1: WO 2012/023394 A.

In Patent Document 1, on a surface of a semiconductor substrate with an ESD protection circuit, an inorganic insulating layer of $SiO_2$ is provided as a protection film, and the inorganic insulating layer is provided with an in-plane wiring of Cu. For this reason, Patent Document 1 has problems such as failure to prevent the capacitance of the ESD protection device itself from being increased, due to the fact that it is not possible to suppress the parasitic capacitance generated between the in-plane wiring and the semiconductor substrate even when it is possible to reduce the influence of parasitic capacitance of the diode.

In addition, in Patent Document 1, because the inorganic insulating layer is formed by a thin-film formation method such as sputtering, asperity appears at the surface of the inorganic insulating layer under the influence of the circuit pattern of the ESD protection circuit formed in the semiconductor substrate. For this reason, when the inorganic insulating layer with surface asperity is provided with the in-plane wiring, parasitic capacitance varies which is generated between the in-plane wiring and the semiconductor substrate. The generation of the varying parasitic capacitance causes problems such as difficulty in adjusting the shift in impedance for high-frequency circuits.

SUMMARY OF THE INVENTION

Therefore, an object of the present invention is to provide a semiconductor device which can reduce the generation of parasitic capacitance, and eliminates variation in parasitic capacitance generated.

A semiconductor device according to the present invention includes: a semiconductor substrate formed with a functional element; a metallic film formed on the surface of the semiconductor substrate and electrically connected to the functional element; and a rewiring layer including a wiring electrode opposed to the surface of the semiconductor substrate, and a contact hole that electrically connects the metallic film and a part of the wiring electrode, and characteristically, the rewiring layer includes a protection film layer formed on the surface of the semiconductor substrate to cover a part of the metallic film except a region in contact with the contact hole, and a resin layer that is lower in dielectric constant than the protection film layer, and formed between the protection film layer and the wiring electrode.

Typically, the protection film layer is sputtered onto the semiconductor substrate of the semiconductor device. In this case, asperity appears at the surface of the protection film layer, and thus, when a wiring electrode is formed on the surface of the protection film layer, the distance varies between the wiring electrode and the semiconductor substrate. Therefore, in the configuration according to the present invention, the distance between the wiring electrode and the semiconductor substrate can be equalized in such a way that the resin layer is formed between the protection film layer and the wiring electrode to achieve smoothing (leveling) of the surface on which the wiring electrode is formed. For this reason, variation can be eliminated in magnitude of parasitic capacitance generated between the wiring electrode and the semiconductor substrate. Furthermore, the parasitic capacitance generated between the wiring electrode and the semiconductor substrate can be suppressed by making the dielectric constant of the resin layer lower than that of the protection film layer.

The protection film layer is preferably formed to be thicker with increasing distance from the contact hole, whereas the resin layer is preferably formed to be thinner with increasing distance from the contact hole.

In this configuration, leveling the surface on which the wiring electrode is formed can equalize the distance between the wiring electrode and the semiconductor substrate. There is a need to form an opening in the protection film layer in order to form the contact hole for electrical connection to the metallic film, and in the formation of the protection film layer by sputtering, the protection film layer around the opening (metallic film) may undergo a decrease in thickness. For this reason, the distance between the wiring electrode and the semiconductor substrate can be equalized in such a way that the resin layer is made thicker around the contact hole, and thinner with increasing distance from the contact hole. As a result, even when parasitic capacitance is generated between the wiring electrode and the semiconductor substrate, the variation in capacitance magnitude can be reduced.

The wiring electrode is preferably shaped such that the area opposed to the semiconductor substrate is smaller with increasing distance from a region in contact with the contact hole.

In this configuration, the parasitic capacitance generated between the wiring electrode and the semiconductor substrate can be reduced by reducing the opposed area.

According to the present invention, the parasitic capacitance generated between the semiconductor substrate and the rewiring layer can be reduced, and variation in parasitic capacitance generated can be reduced.

DETAILED DESCRIPTION OF EXEMPLARY EMBODIMENTS

Hereinafter, the semiconductor device according to the present invention will be described with reference to ESD protection devices as examples.

Embodiment 1

Figure 1:
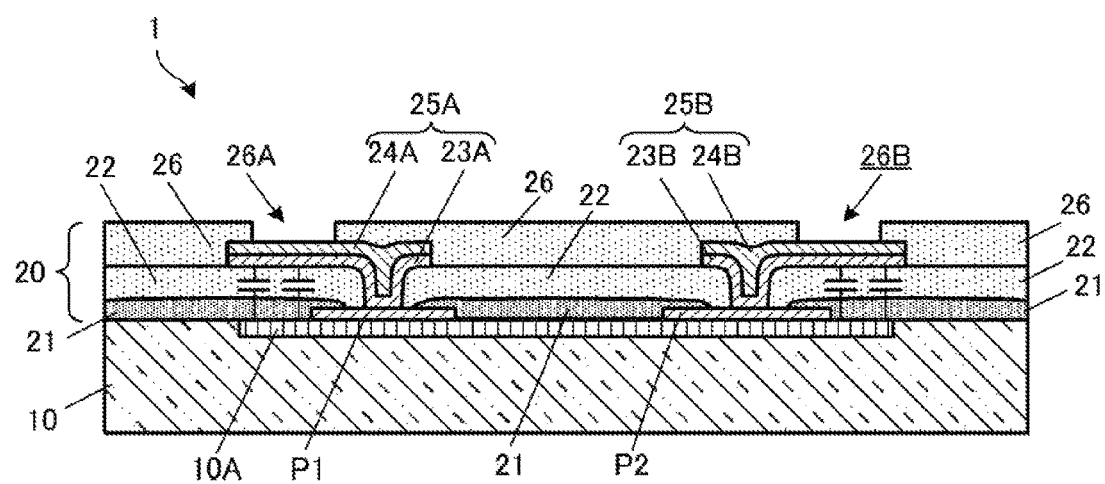
FIG. 1 is a front cross-sectional view of an ESD protection device according to Embodiment 1.
Figure 2:
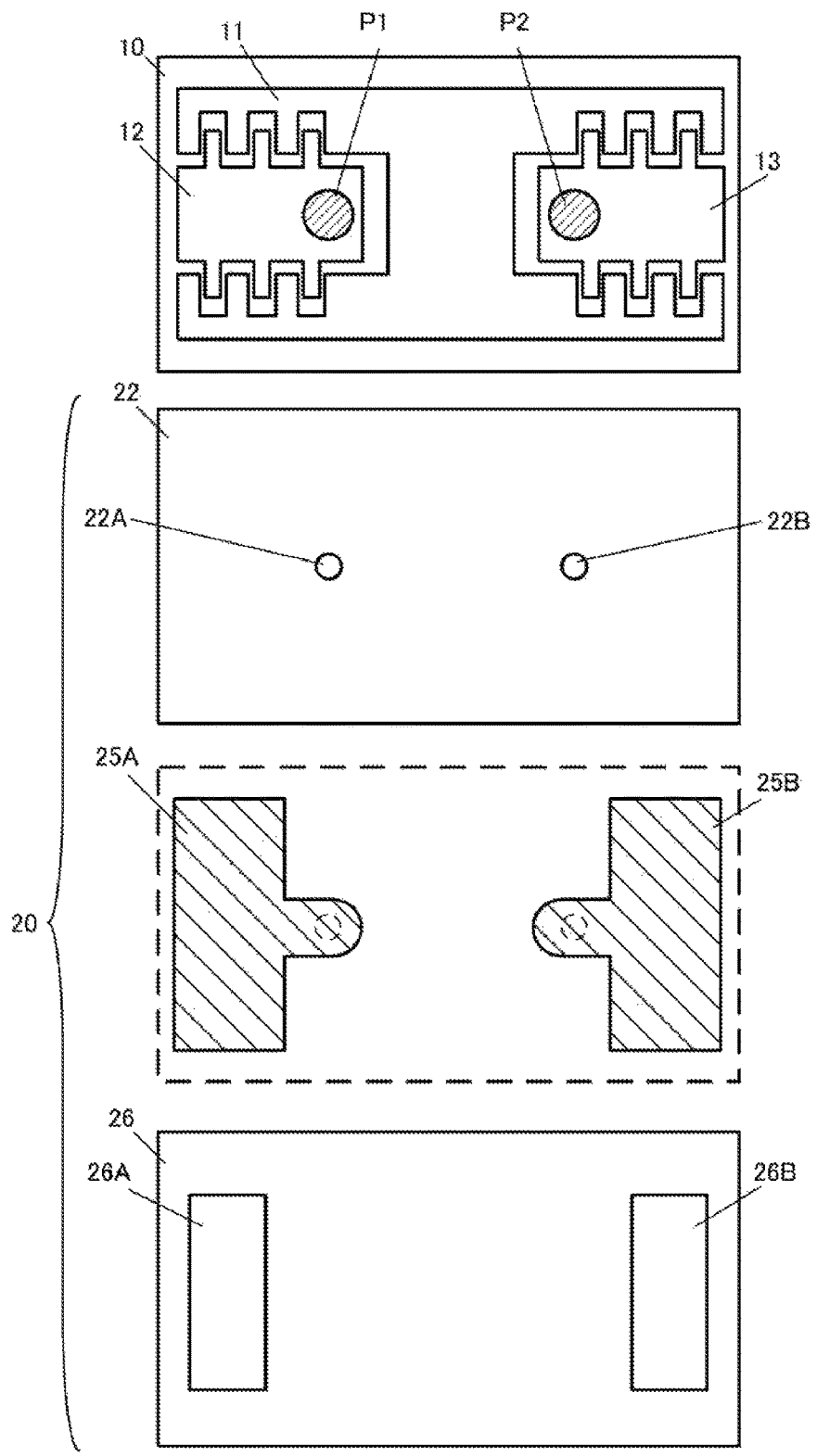
FIG. 2 is a plan view of respective layers of the ESD protection device.

FIG. 1 is a front cross-sectional view of an ESD protection device 1 according to Embodiment 1. FIG. 2 is a plan view of respective layers of the ESD protection device 1. The ESD protection device 1 is a CSP (Chip Size Package) type device, where a rewiring layer 20 including multiple resin layers, etc. is formed on a Si substrate 10 configured to have an ESD protection circuit 10A including a diode and a zener diode. While the Si substrate 10 corresponds to a semiconductor substrate according to the present invention, the semiconductor substrate according to the present invention is not limited to any Si substrate, but may be a GaAs substrate or the like.

Figure 3:
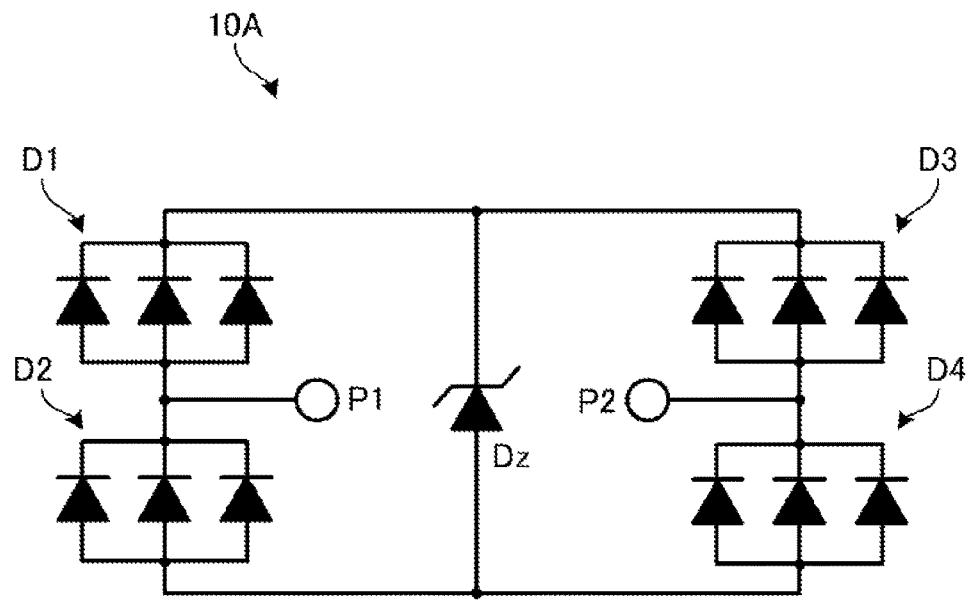
FIG. 3 is a diagram illustrating an ESD protection circuit formed on a Si substrate.

FIG. 3 is a diagram illustrating the ESD protection circuit 10A formed in the Si substrate 10. The Si substrate 10 will be described with reference to FIGS. 1 to 3.

The Si substrate 10 has, on a surface thereof, element forming regions 11, 12, and 13 provided. Specifically, a p-epitaxial layer is formed in a p+ type substrate, n wells and p wells are sequentially formed in the p-epitaxial layer, and the wells and a p-diffusion layer or an n-diffusion layer form diodes and zener diodes in the Si substrate 10. In the present embodiment, formed are respective diodes D1, D2, D3, D4 that each have three diodes aligned in the forward direction and connected in parallel, and a zener diodes Dz, as shown in FIG. 3. The diodes D1, D2, D3, D4 and the zener diodes Dz correspond to functional elements according to the present invention.

The diodes D1, D2 are aligned in the forward direction and connected in series, whereas the diodes D3, D4 are aligned in the forward direction and connected in series. In addition, the diodes D1, D2 and the diodes D3, D4 are each aligned in the forward direction, and connected in parallel with the zener diode Dz. Furthermore, the zener diode Dz is formed between the forming regions of the diodes D1, D4, and between the forming regions of the diodes D2, D3.

The Si substrate 10 has Al pads (hereinafter, referred to as pads) P1, P2 formed. The pad P1 is formed in a position extended from the connection point between the diodes D1, D2, whereas the pad P2 is formed in a position extended from the connection point between the diodes D3, D4. The pads P1, P2 refers to input/output terminals for the ESD protection circuits 10A, and correspond to metallic films according to the present invention.

Returning to FIG. 1, the rewiring layer 20 formed on the surface layer of the Si substrate 10 includes a SiN protection film (protection film layer) 21 formed on the surface of the Si substrate 10 so as to partially cover the pads P1, P2. The SiN protection film 21, which is made by sputtering on the surface of the Si substrate 10, has openings formed by etching. The SiN protection film 21 formed by sputtering has surface asperity appearing in deposition principle. It is to be noted that the SiN protection film 21 has a relatively high relative permittivity of 7 to 8.

Furthermore, the rewiring layer 20 includes a resin layer 22 formed on the Si substrate 10. This resin layer 22 has openings (contact holes) 22A, 22B (see FIG. 2) in the positions of the openings formed in the SiN protection film 21. The pads P1, P2 are exposed from the openings 22A, 22B, and electrically connected to electrodes formed in the openings 22A, 22B. The resin layer 22 has an epoxy (or polyimide) resin that is lower in dielectric constant than the SiN protection film 21, and has a relative permittivity of 2 to 6. The surface of the resin layer 22 on which electrodes are to be formed as will be described later can be subjected to smoothing (leveling) by forming the resin layer 22 so as to cover the SiN protection film 21 with surface asperity.

In addition, the SiN protection film 21 is formed by sputtering, thus in the case of forming openings, small in thickness around the openings, and closer to a smooth state with increasing distance from the openings (contact holes) in a planar direction. More specifically, the SiN protection film 21 is small in thickness around the pads P1, P2 (around the contact holes), and thicker with increasing distance from the pads P1, P2 (contact holes) in a planar direction. Further, the resin layer 22 formed so as to cover the SiN protection film 21 is thick around the pads P1, P2 (around the contact holes), and thinner with increasing distance from the pads P1, P2 (contact holes) in a planar direction.

The rewiring layer 20 includes Cu/Ti electrodes 23A, 23B and Au/Ni electrodes 24A, 24B. The Cu/Ti electrodes 23A, 23B and Au/Ni electrodes 24A, 24B are deposited by sputtering, and formed on the surface of the resin layer 22, and in the openings 22A, 22B. Among the Cu/Ti electrodes 23A, 23B and the Au/Ni electrodes 24A, 24B, the parts formed in the openings 22A, 22B have electrical connection to the pads P1, P2. Hereinafter, the Cu/Ti electrode 23A and the Au/Ni electrode 24A, as well as the Cu/Ti electrode 23B and the Au/Ni electrode 24B are respectively referred to as terminal electrodes 25A, 25B. The terminal electrodes 25A, 25B are input/output electrodes of the ESD protection device 1.

The rewiring layer 20 includes a resin layer 26 further formed on the resin layer 22. The resin layer 26 is, for example, a layer of low-dielectric-constant epoxy resin. Parts of the resin layer 26, which are opposed to parts of the terminal electrodes 25A, 25B treated as input/output terminals of the ESD protection device 1, have rectangular openings 26A, 26B formed.

Thus, in the ESD protection device 1, parasitic capacitance is generated between the Si substrate 10 (or the ESD protection circuit 10A) and the terminal electrodes 25A, 25B. However, the parasitic capacitance generated can be suppressed, because the low-dielectric-constant resin layer 22 is formed between the Si substrate 10 and the terminal electrodes 25A, 25B. Furthermore, variation in distance can be eliminated between the Si substrate 10 and the terminal electrodes 25A, 25B, because the SiN protection film 21 with asperity appearing on the surface thereof is subjected to leveling with the resin layer 22. For this reason, variation in parasitic capacitance generated can be suppressed. As a result, the shift in impedance can be reduced for a high-frequency circuit provided with the ESD protection device 1, and loss of signal can be reduced for the high-frequency circuit.

It is to be noted that while an example of forming the zener diode Dz and the like in the Si substrate 10 to constitute the ESD protection circuit 10A has been provided in the present embodiment, for example, a variable-capacitance element and the like may be formed in the Si substrate 10 to constitute a circuit with the use of the element.

An example of the structure of the Si substrate 10 will be described below in the formation of an ESD protection circuit in the Si substrate 10. The structure shown in FIG. 2 has the diodes D1 to D4 formed at the surface of the Si substrate 10, and the zener diode Dz formed in the thickness direction of the Si substrate 10.

Figure 4:
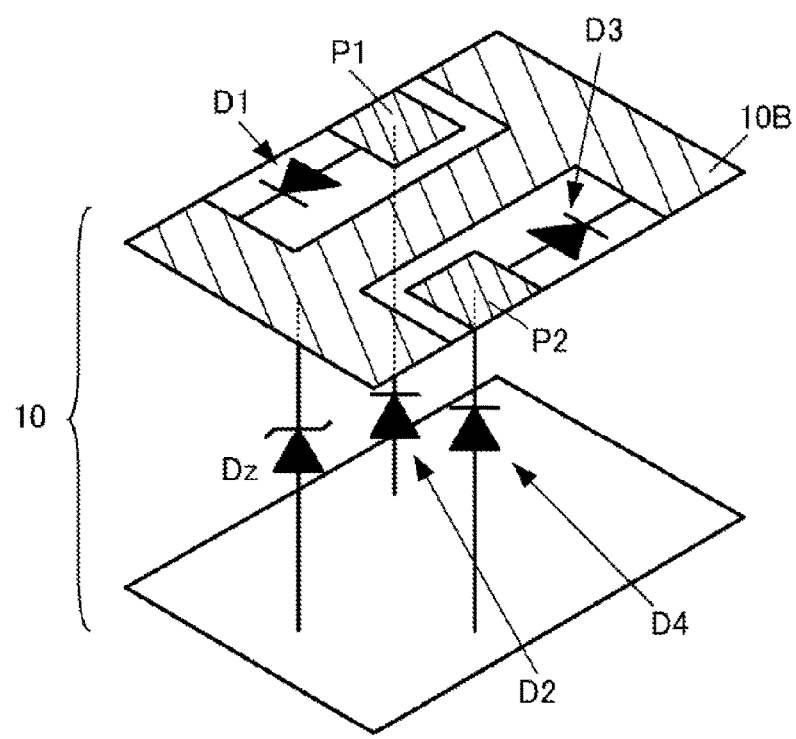
FIG. 4 is a diagram illustrating a first structure example in the formation of an ESD protection circuit on a Si substrate.
Figure 5:
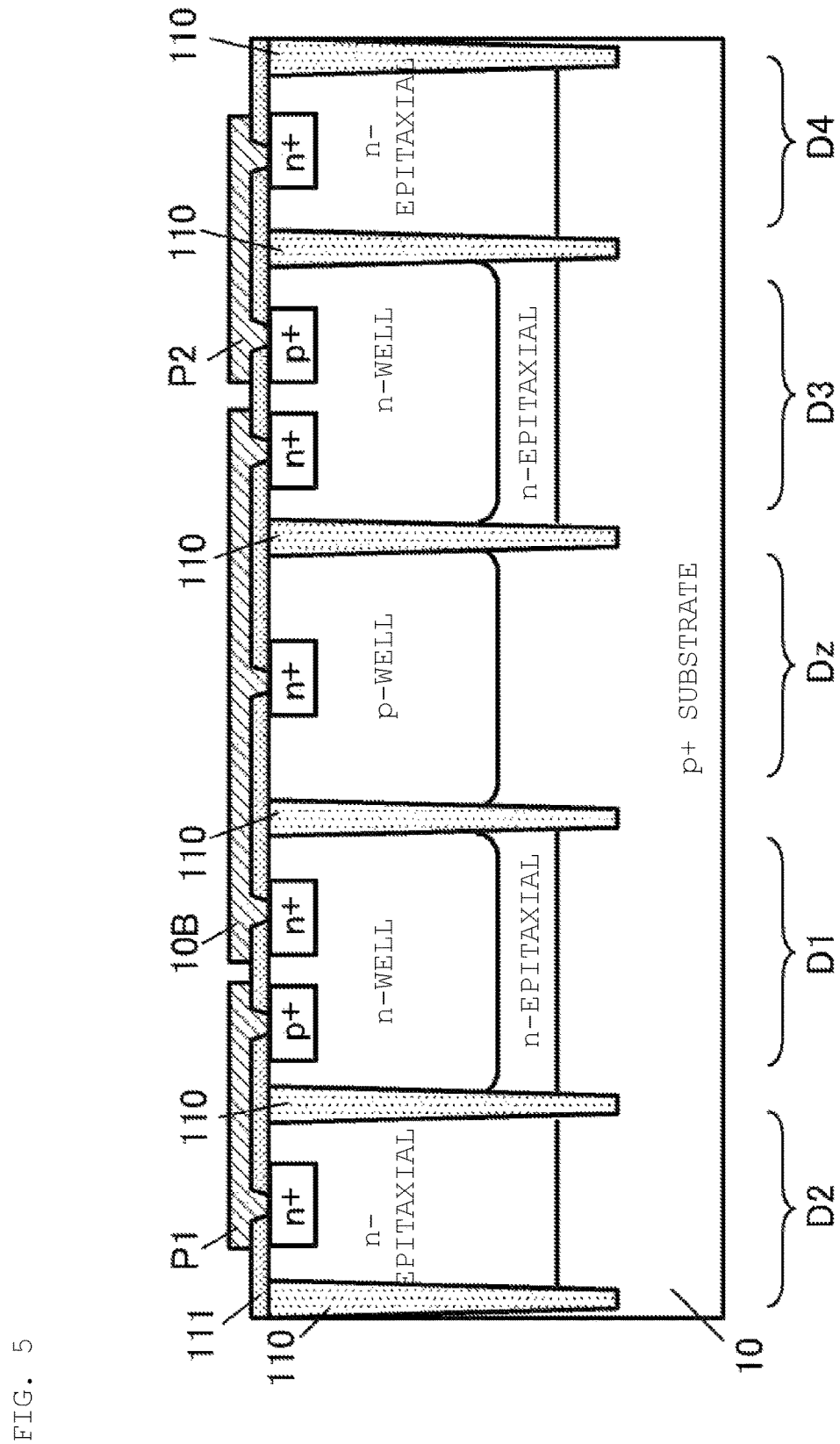
FIG. 5 is a pattern diagram of the Si substrate of the first structure example shown in FIG. 4.

FIG. 4 is a diagram illustrating a first structure example in the formation of an ESD protection circuit in the Si substrate 10. FIG. 5 is a pattern diagram of the Si substrate 10 of the first structure example shown in FIG. 4.

In this first structure example, the Si substrate 10 is a p+ type substrate, and the p+ type substrate has element separation films 110 formed by a STI (Shallow Trench Isolation) method. The diodes D1 to D4 and the zener diode Dz are formed in the respective regions formed by the element separation film 110. Specifically, an n-epitaxial layer is formed and n+ diffusion layers form the diodes D2, D4 in the thickness direction of the Si substrate 10. In addition, a p well is formed, and an n+ diffusion layer forms the zener diode Dz in the thickness direction of the Si substrate 10. Furthermore, n wells are formed in the n-epitaxial layers, and p+ diffusion layers and n+ diffusion layers form the diodes D1, D3 at the surface of the Si substrate 10.

On the surface of the Si substrate 10, a $SiO_2$ film 111 is formed, and the pad P1 is formed to bridge the regions with the diodes D1, D2 formed, whereas the pad P2 is formed so as to bridge the regions with the diodes D3, D4 formed. Furthermore, an Al electrode 10B is formed on the diodes D1, D3, and the surface of the Si substrate 10, except the regions with the pads P1, P2 formed. The Al electrode 10B is formed so as to bridge the regions with the diodes D1, D3 and the zener diode Dz.

The thus formed ESD protection circuit is equivalent to that in FIG. 3. It is to be noted that while the diodes D1 to D4 each have three diodes aligned in the forward direction and connected in parallel in FIG. 3, the diodes D1 to D4 each have one diode in FIG. 4.

Figure 6:
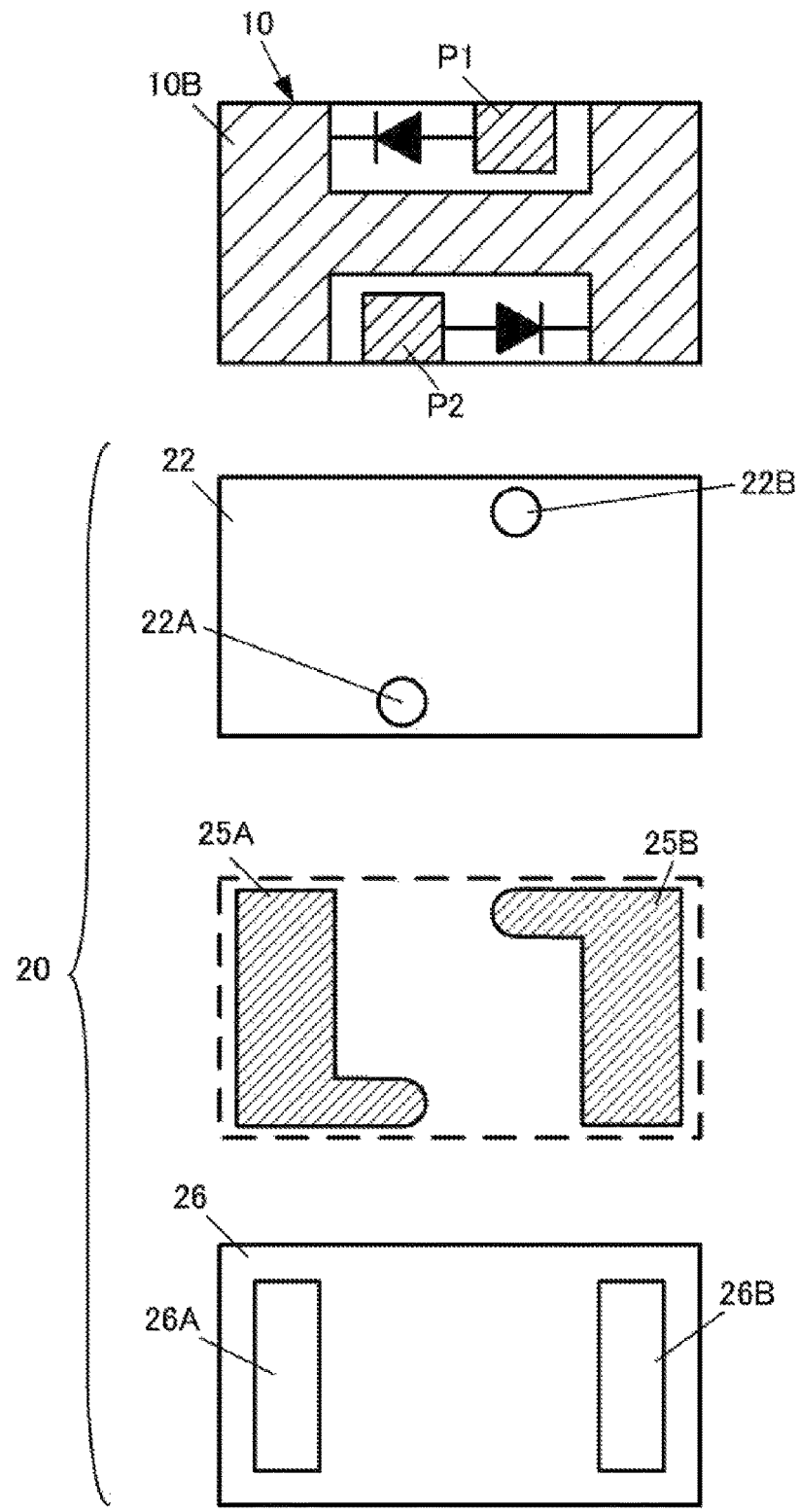
FIG. 6 is a plan view of respective layers of an ESD protection device including the Si substrate of the first structure example shown in FIG. 4.

FIG. 6 is a plan view of respective layers of an ESD protection device including the Si substrate 10 of the first structure example shown in FIG. 4. The resin layer 22 included in the rewiring layer 20 formed on the Si substrate 10 has openings (contact holes) 22A, 22B formed. The pads P1, P2 are exposed from the openings 22A, 22B, and electrically connected to electrodes formed in the openings 22A, 22B.

Furthermore, the rewiring layer 20 includes terminal electrodes 25A, 25B formed on the surface of the resin layer 22 and the openings 22A, 22B. The terminal electrodes 25A, 25B include Cu/Ti electrodes and Au/Ni electrodes as described with FIG. 1. The terminal electrodes 25A, 25B are formed so as to cover the zener diode formed in the Si substrate 10 in the thickness direction of the ESD protection device 1. Thus, noise from the zener diode is prevented from being radiated. Parts of the resin layer 26 of the rewiring layer 20, which are opposed to parts of the terminal electrodes 25A, 25B treated as input/output terminals of the ESD protection device 1, have rectangular openings 26A, 26B formed.

Figure 7:
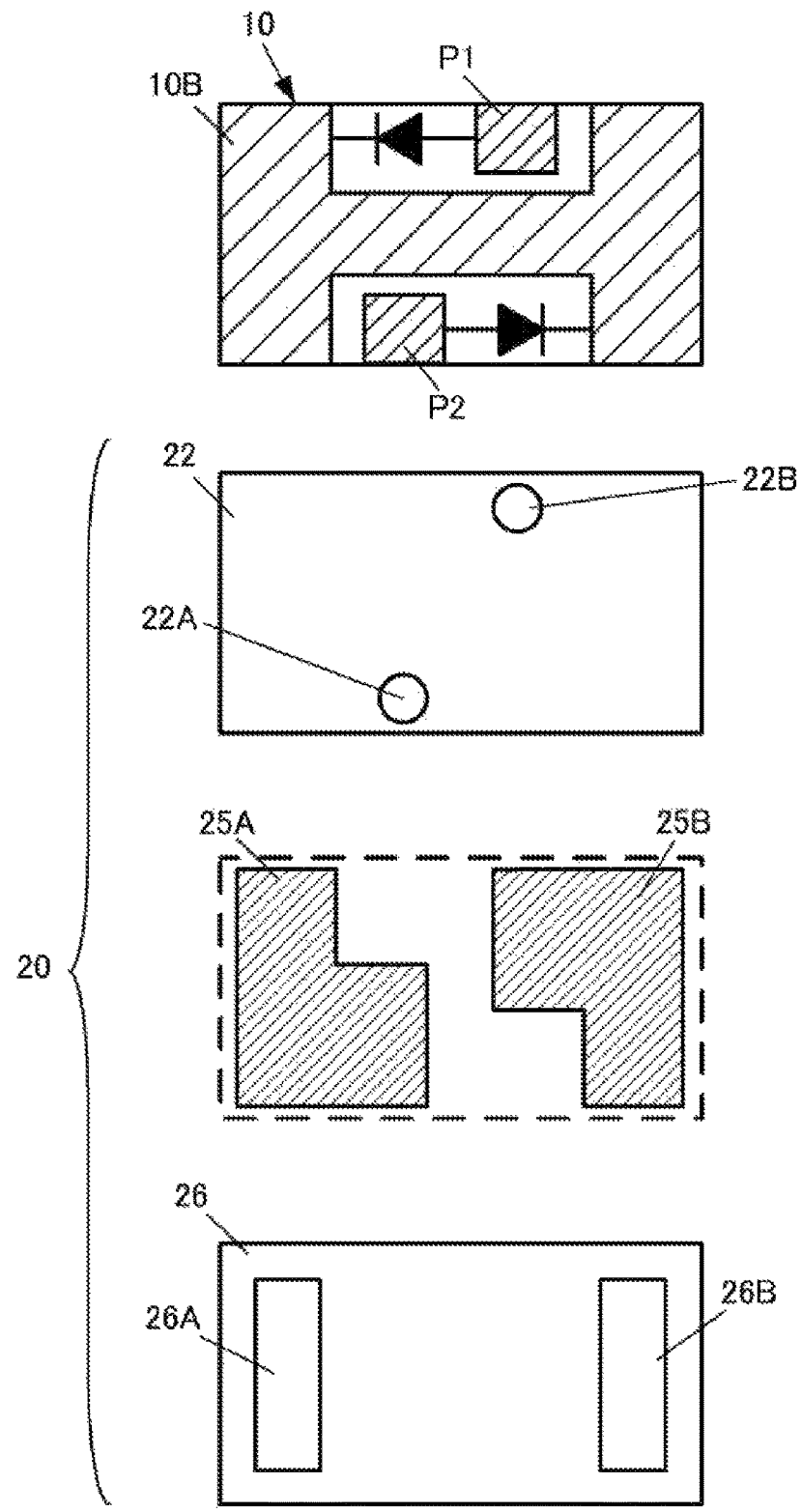
FIG. 7 is a plan view of respective layers of an ESD protection device as another example differently from FIG. 6.

It is to be noted that the terminal electrodes 25A, 25B may be shaped as shown in FIG. 7. FIG. 7 is a plan view of respective layers of an ESD protection device as another example differently from FIG. 6. In this example, the terminal electrodes 25A, 25B cover the Al electrode 10B almost entirely (the region with the zener diode formed). In this case, noise from the zener diode is further prevented from being radiated, as compared with the case in FIG. 6.

Figure 8:
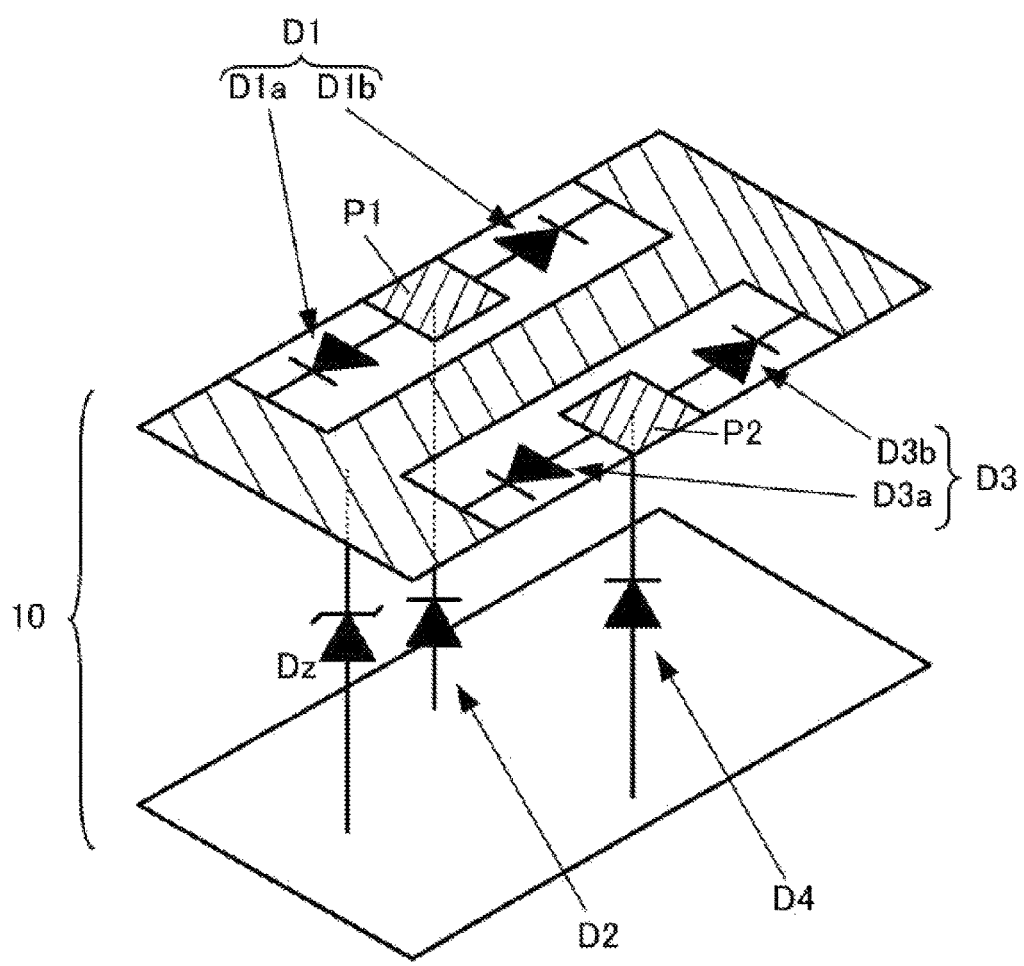
FIG. 8 is a diagram illustrating a second structure example in the formation of an ESD protection circuit on a Si substrate.

FIG. 8 is a diagram illustrating a second structure example in the formation of an ESD protection circuit in the Si substrate 10. In this second structure example, the diodes D2, D4 and the zener diode Dz are formed in the thickness direction of the Si substrate 10, as in the first structure example. In addition, the diodes D1a, D1b (diode D1) and the diodes D3a, D3b (diode D3) are formed at the surface of the Si substrate 10. Furthermore, the pads P1, P2 and the Al electrode 10B are formed at the surface of the Si substrate 10.

The thus formed ESD protection circuit is equivalent to that in FIG. 3. It is to be noted that while the diodes D1 to D4 each have three diodes aligned in the forward direction and connected in parallel in FIG. 3, in FIG. 8, the diodes D1, D3 each have two diodes, whereas the diodes D1, D4 each have one diode.

Figure 9:
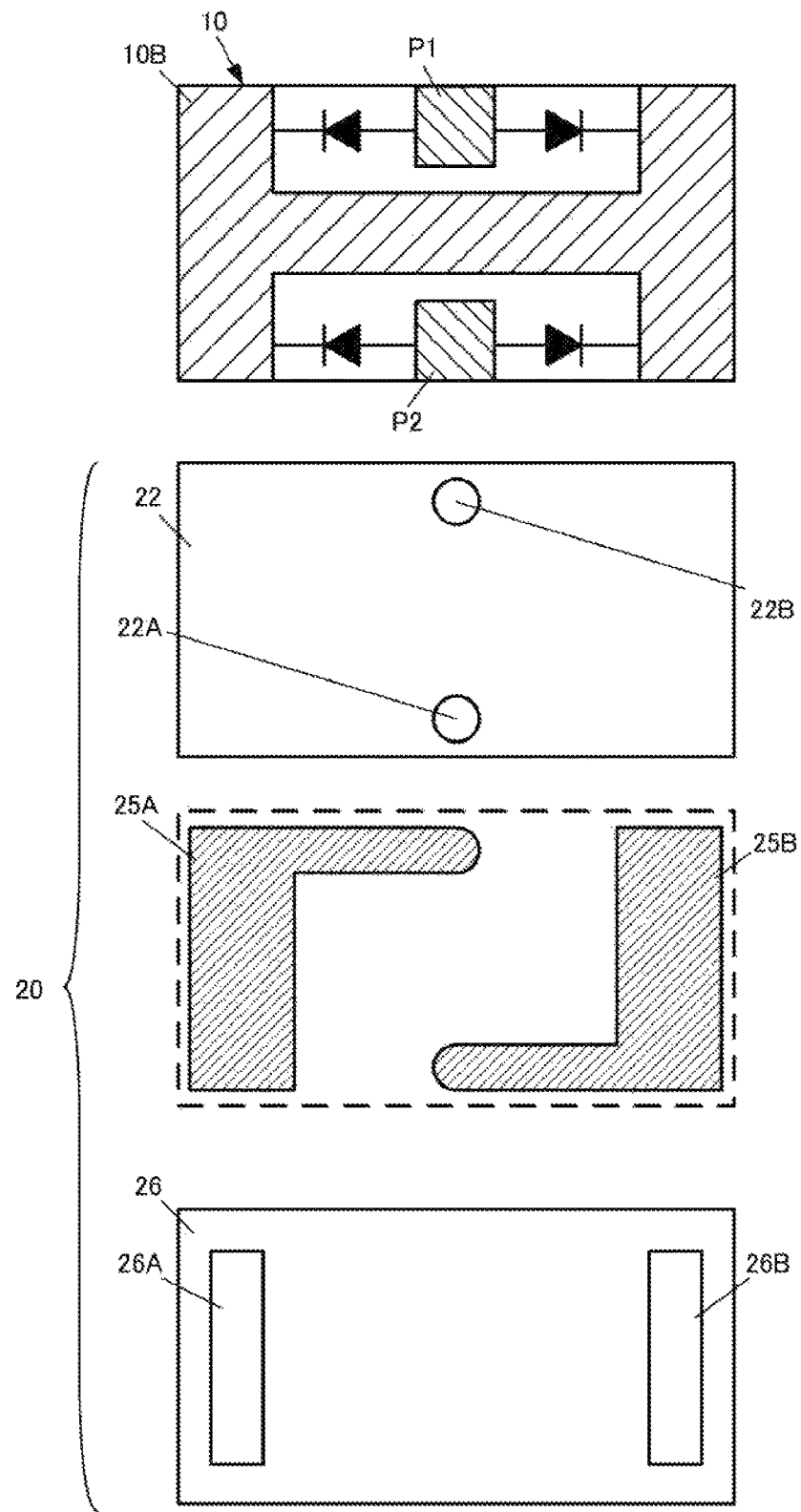
FIG. 9 is a plan view of respective layers of an ESD protection device including the Si substrate of the second structure example shown in FIG. 8.

FIG. 9 is a plan view of respective layers of an ESD protection device including the Si substrate 10 of the second structure example shown in FIG. 8. The resin layer 22 included in the rewiring layer 20 formed on the Si substrate 10 has openings (contact holes) 22A, 22B formed. The pads P1, P2 are exposed from the openings 22A, 22B, and electrically connected to electrodes formed in the openings 22A, 22B.

Furthermore, the rewiring layer 20 includes terminal electrodes 25A, 25B formed on the surface of the resin layer 22 and the openings 22A, 22B. The terminal electrodes 25A, 25B include Cu/Ti electrodes and Au/Ni electrodes as described with FIG. 1. The terminal electrodes 25A, 25B are formed so as to cover the zener diode formed in the Si substrate 10 in the thickness direction of the ESD protection device 1. Thus, noise from the zener diode is prevented from being radiated. Parts of the resin layer 26 of the rewiring layer 20, which are opposed to parts of the terminal electrodes 25A, 25B treated as input/output terminals of the ESD protection device 1, have rectangular openings 26A, 26B formed.

In the first structure example and second structure example, the diodes and the zener diodes are formed in the thickness direction of the Si substrate 10, and the ESL component can be thus reduced as compared with the case of the diodes formed at the surface of the Si substrate 10.

Connection examples and a principle for operation will be described below with the ESD protection device 1 according to the present embodiment.

Figure 10A:
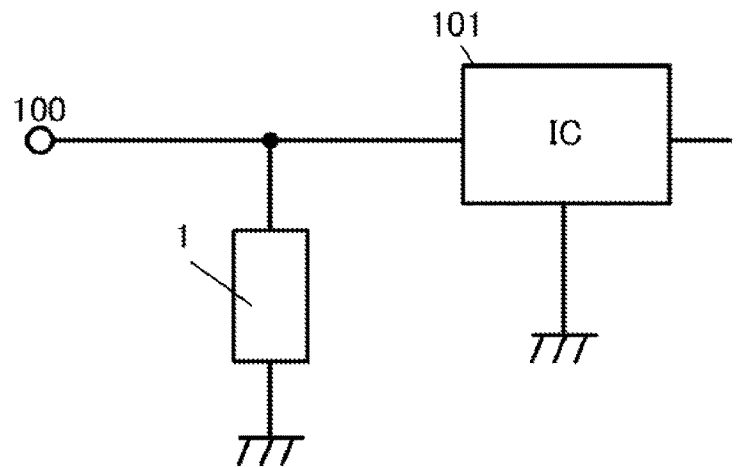
FIG. 10A is a diagram illustrating an example of connecting the ESD protection device according to Embodiment 1.
Figure 10B:
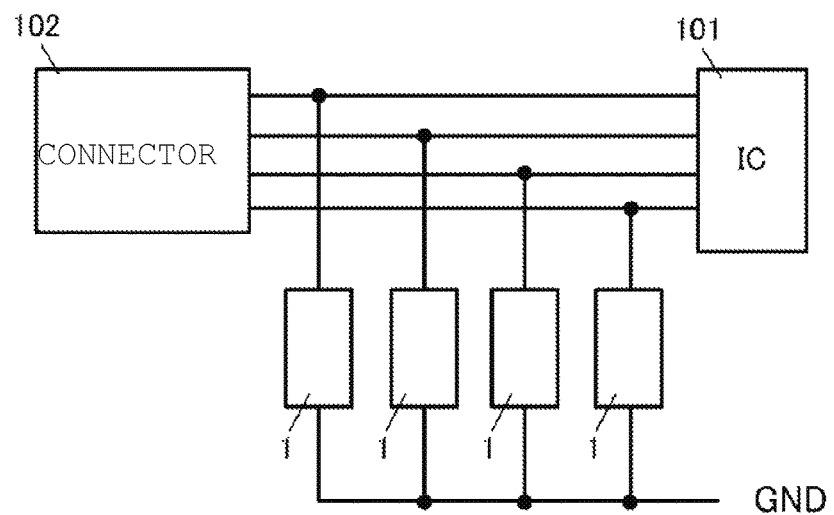
FIG. 10B is a diagram illustrating an example of connecting the ESD protection device according to Embodiment 1.

FIGS. 10A and 10B are diagrams illustrating examples of connecting the ESD protection device 1 according to the present embodiment. The ESD protection device 1 is mounted on an electronic device. Examples of the electronic device include laptop PCs, tablet terminals, cellular phones, digital cameras, and portable music players.

FIG. 10A shows an example of connecting the ESD protection device 1 between a signal line connecting an I/O port 100 and an IC 101 to be protected, and GND.

The I/O port 100 is, for example, a port to which an antenna is connected. The ESD protection device 1 according to the present embodiment is bidirectional, and any of the first input/output terminal and second input/output terminal may serve as an input terminal. For example, when the first input/output terminal is treated as an input terminal, the first input/output terminal is connected to the signal line, whereas the second input/output terminal is connected to the GND.

FIG. 10B shows an example of connecting the ESD protection devices 1 between signal lines connecting a connector 102 and an IC 101, and a GND line. The signal lines in this example are, for example, high-speed transmission lines (differential transmission lines), and the ESD protection device 1 is connected between each of the multiple signal lines and the GND line.

Figure 11:
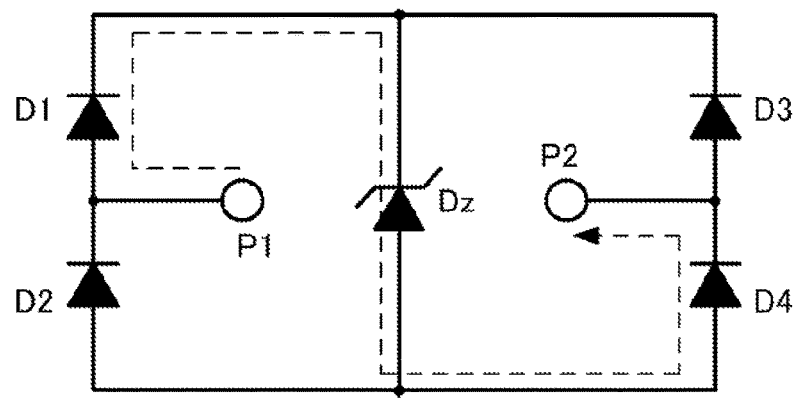
FIG. 11 is a diagram for explaining a principle for operation of the ESD protection device according to Embodiment 1.
Figure 12:
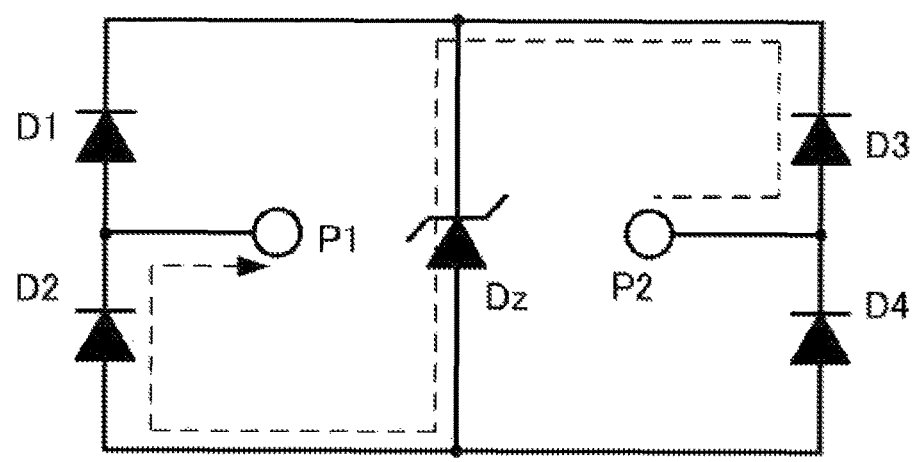
FIG. 12 is a diagram for explaining a principle for operation of the ESD protection device according to Embodiment 1.
Figure 13A:
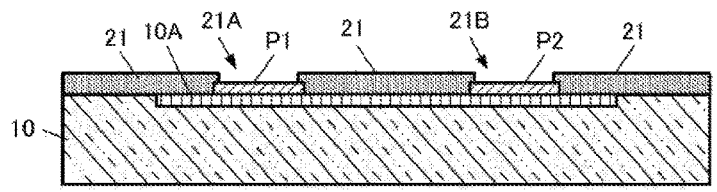
FIG. 13 is a diagram illustrating a process for manufacturing an ESD protection device.
Figure 13B:
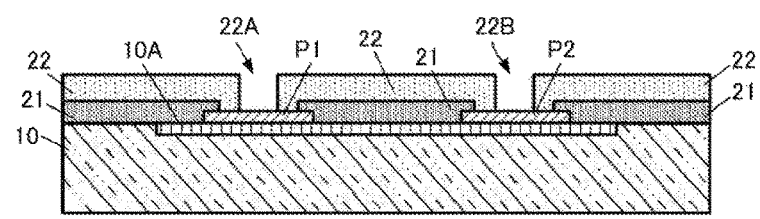
Figure 13C:
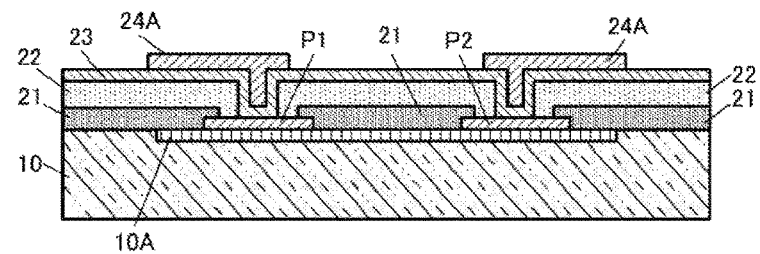
Figure 13D:
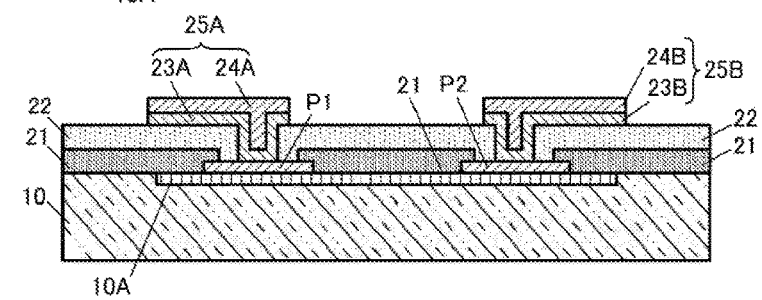
Figure 13E:
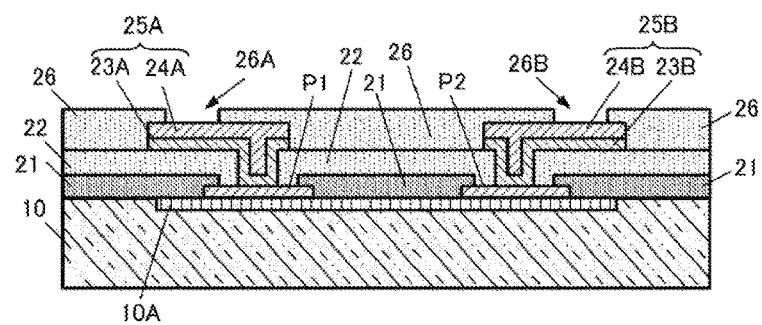

FIGS. 11 and 12 are diagrams for explaining a principle for operation of the ESD protection device according to the present embodiment.

FIG. 11 is a diagram for explaining a case of electric current flowing from the pad P1 connected to the first input/output terminal (terminal electrode 25A), to the pad P2 connected to the second input/output terminal (terminal electrode 25B). When a surge voltage in excess of the zener voltage of the zener diode Dz is applied, a surge current coming from the first input terminal flows through a pathway from the pad P1 to the diode D1, the zener diode Dz, and the diode D4, and is discharged from the pad P2 to the ground, as indicated by a dashed line in the figure.

FIG. 12 is a diagram for explaining a case of electric current flowing from the pad 2 connected to the second input/output terminal (terminal electrode 25B), to the pad P1 connected to the first input/output terminal (terminal electrode 25A). In this case, as indicated by a dashed line in the figure, a surge current coming from the second input terminal flows through a pathway from the pad P2 to the diode D3, the zener diode Dz, and the diode D2, and is discharged from the pad P1 to the ground.

It is to be noted that capacitance is generated between the Al electrode 10B and the terminal electrodes 25A, 25B in the ESD protection device which has the first structure example shown in FIG. 6 and the second structure example shown in FIG. 8. This capacitance bypasses a high-frequency voltage applied to the zener diode, from the Al electrode 10B through the terminal electrode 25A (or 25B) and the pad P1 (or P2) to the ground. The bypass of the high-frequency voltage can lower the peak voltage of the ESD.

A process for manufacturing the ESD protection device will be described below.

FIG. 13 is a diagram illustrating a process for manufacturing the ESD protection device 1. It is to be noted that the illustration of asperity appearing at the surface of the SiN protection film 21 during the formation thereof is omitted in FIG. 13.

The ESD protection device 1 is manufactured in accordance with the following process.

(A) First, on the Si substrate 10 with the ESD protection circuit 10A formed therein, the pads P1, P2 electrically connected to the ESD protection circuit 10A are formed by photolithography. Further, the SiN protection film 21 is made by sputtering onto the substrate surface, and openings 21A, 21B are formed by etching.

It is to be noted that the reduced areas of the pads P1, P2 can reduce the parasitic capacitance formed between the pads and the opposed substrate (ESD protection circuit 10A). The shift of the impedance can be suppressed by reducing the parasitic capacitance, and as a result, the loss in the signal line can be reduced.

(B) Next, the Si substrate 10 is subjected to spin coating with an epoxy solder resist to form the resin layer 22, and the openings 22A, 22B are formed. The formation of the resin layer 22 can achieve leveling of the surfaces on which the terminal electrodes 25A, 25B are formed.

(C) On the surface of the resin layer 22, a Cu/Ti electrode 23 is deposited by sputtering to be approximately 1.0 μm/0.1 μm in thickness, and thereafter, the Au/Ni electrodes 24A, 24B are deposited by sputtering to be approximately 0.1 μm/5.0 μm in thickness. It is to be noted that the Au/Ni electrodes 24A, 24B are only partially formed by masking.

(D) Subsequently, the Cu/Ti electrode 23 is subjected to wet etching to form the Cu/Ti electrodes 23A, 23B. Thus, the terminal electrodes 25A, 25B are formed.

(E) Thereafter, the surface of the resin layer 22 is subjected to spin coating with an epoxy solder resist to form the resin layer 26, and the openings 26A, 26B are formed.

Embodiment 2

An ESD protection device according to Embodiment 2 will be described below only in terms of the difference from Embodiment 1.

Figure 14:
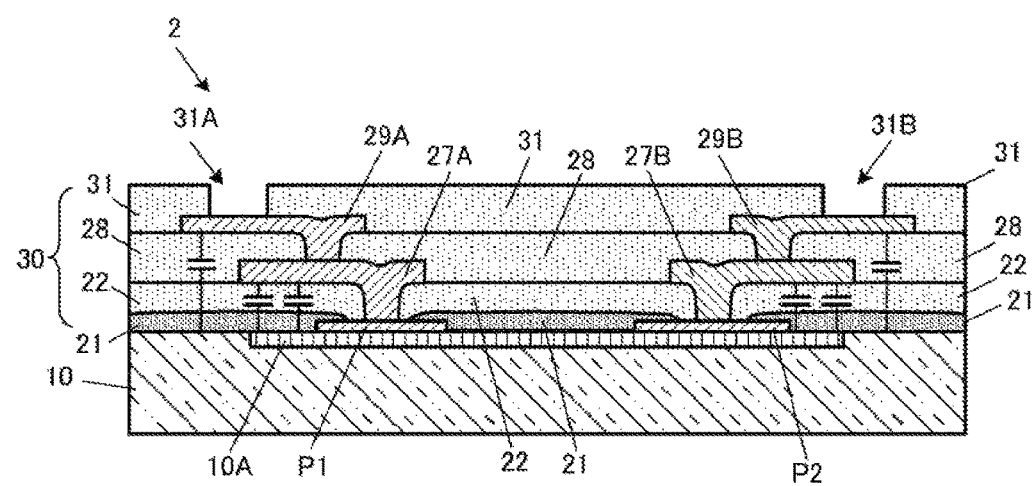
FIG. 14 is a front cross-sectional view of an ESD protection device according to Embodiment 2.
Figure 15:
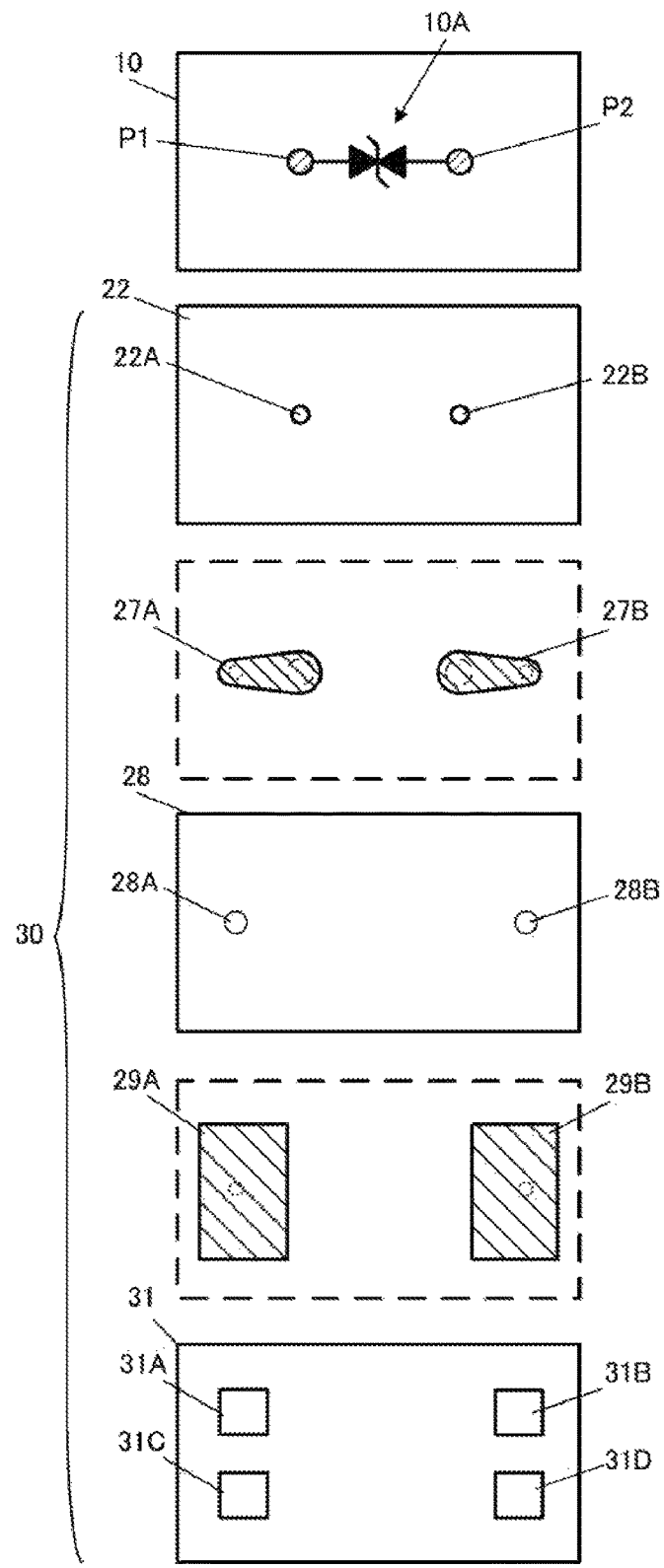
FIG. 15 is a plan view of respective layers of the ESD protection device.

FIG. 14 is a front cross-sectional view of an ESD protection device 2 according to Embodiment 2. FIG. 15 is a plan view of respective layers of the ESD protection device 2. It is to be noted that the specific configuration of an ESD protection circuit 10A formed in a Si substrate 10 is omitted in FIG. 15.

The ESD protection device 2 has a rewiring layer 30 formed on the Si substrate 10.

The Si substrate 10, the ESD protection circuit 10A formed in the Si substrate 10, and the pads P1, P2 are equivalent to those in Embodiment 1.

On the Si substrate 10, a SiN protection film 21 is formed. The rewiring layer 30 includes a resin layer 22 for leveling asperity of the SiN protection film 21. As in Embodiment 1, the SiN protection film 21 is small in thickness around contact holes (openings 22A, 22B), and thicker with increasing distance from the contact holes in a planar direction. Further, the resin layer 22 formed so as to cover the SiN protection film 21 is thick around the contact holes, and thinner with increasing distance from the contact holes in a planar direction.

Intermediate wiring electrodes 27A, 27B electrically connected to the pads P1, P2 are formed in the openings formed in the SiN protection film 21 and the resin layer 22, and on the surface of the resin layer 22. The intermediate wiring electrodes 27A, 27B are Ti/Cu/Ti electrodes. The intermediate wiring electrodes 27A, 27B are shaped to be smaller in width with increasing distance from parts overlapped with the pads P1, P2 in a planar direction in planar view in FIG. 14. In addition, the intermediate wiring electrodes 27A, 27B are deposited and formed by sputtering.

The rewiring layer 30 includes a resin layer 28 and terminal electrodes 29A, 29B further formed on the resin layer 22. This resin layer 28 also has, as in the resin layer 22, openings 28A, 28B formed at sites corresponding to ends of the intermediate wiring electrodes 27A, 27B, which are smaller in width (hereinafter, referred to as small width parts). The terminal electrodes 29A, 29B are deposited by sputtering Cu/Ti electrodes and Au/Ni electrodes, and formed on the surface of the resin layer 28 and in the openings (via holes) 28A, 28B of the resin layer 28. Parts of the terminal electrodes 29A, 29B, which are formed in the openings 28A, 28B, have electrical connection to the small width parts of the intermediate wiring electrodes 27A, 27B. The terminal electrodes 29A, 29B are input/output electrodes of the ESD protection device 2.

Moreover, the rewiring layer 30 includes a resin layer 31 further formed on the resin layer 28. The resin layer 31 is a layer of low-dielectric-constant epoxy resin. Parts of the resin layer 31, which are opposed to parts of the terminal electrodes 29A, 29B, have rectangular openings 31A, 31B, 31C, and 31D formed. These resin layers 28, 31 are formed from and by the same material and production method as the resin layers 22, 26.

It is to be noted that the openings 31A, 31B, 31C, and 31D are preferably formed to be kept away from the positions of the via holes in the resin layer 28. Parts of the terminal electrodes 29A, 29B in the via holes may have depressions (omitted in FIG. 14) caused in the manufacturing process. When the depressions are exposed from the openings 31A, 31B, 31C, and 31D, there is a possibility that soldering in the openings 31A, 31B, 31C, and 31D will cause air to be accumulated in the depressions, thereby decreasing the connection reliability. For this reason, the decrease in connection reliability can be prevented by forming the openings 31A, 31B, 31C, and 31D to be kept away from the positions of the via holes.

Thus, in the ESD protection device 2, as in Embodiment 1, parasitic capacitance can be reduced which is generated between the Si substrate 10 (or ESD protection circuit 10A) and the intermediate wiring electrodes 27A, 27B, and variation in parasitic capacitance generated can be reduced. Moreover, due to the interposition of the low-dielectric-constant resin layer 22 therebetween, even parasitic capacitance can be suppressed which is generated between the Si substrate 10 and the terminal electrodes 29A, 29B.

In addition, the intermediate wiring electrodes 27A, 27B according to the present embodiment are shaped to be smaller in width with increasing distance from the parts overlapped with the pads P1, P2 in planar view. Therefore, as compared with the case of being constant in width, for example, rectangular, the opposed areas are reduced between the Si substrate 10 and the intermediate wiring electrodes 27A, 27B, and the parasitic capacitance is also reduced. For this reason, the low-dielectric-constant resin layer 22 is reduced in thickness with increasing distance from the contact holes (openings 22A, 22B) in a planar direction, while reducing the opposed areas between the Si substrate 10 and the intermediate wiring electrodes 27A, 27B can suppress an increase in parasitic capacitance.

Figure 16:
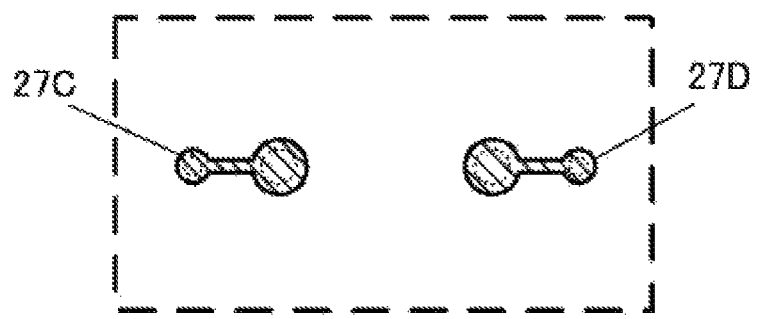
FIG. 16 is a plan view illustrating an example of intermediate wiring electrodes in different shapes.

It is to be noted that the shapes of the intermediate wiring electrodes 27A, 27B for reducing the areas opposed to the Si substrate 10 is not limited to the shapes in FIG. 15. FIG. 16 is a plan view illustrating an example of intermediate wiring electrodes in different shapes. The intermediate wiring electrodes 27C, 27D shown in FIG. 16 have circular contact hole parts electrically connected to the pads P1, P2 and circular via hole parts electrically connected to the terminal electrodes 29A, 29B, and thin wire electrodes connecting the contact hole parts and the via hole parts. Thus, the opposed areas are reduced between the Si substrate 10 and the intermediate wiring electrodes 27C, 27D, and the parasitic capacitance is reduced. It is to be noted that the intermediate wiring electrodes 27C, 27D are formed by sputtering as Ti/Cu/Ti electrodes, as with the intermediate wiring electrodes 27A, 27B.

The ESD protection device 2 according to Embodiment 2 has the same principle for operation and manufacturing process as in Embodiment 1, and descriptions of the principle and process will be thus omitted.

Figure 17:
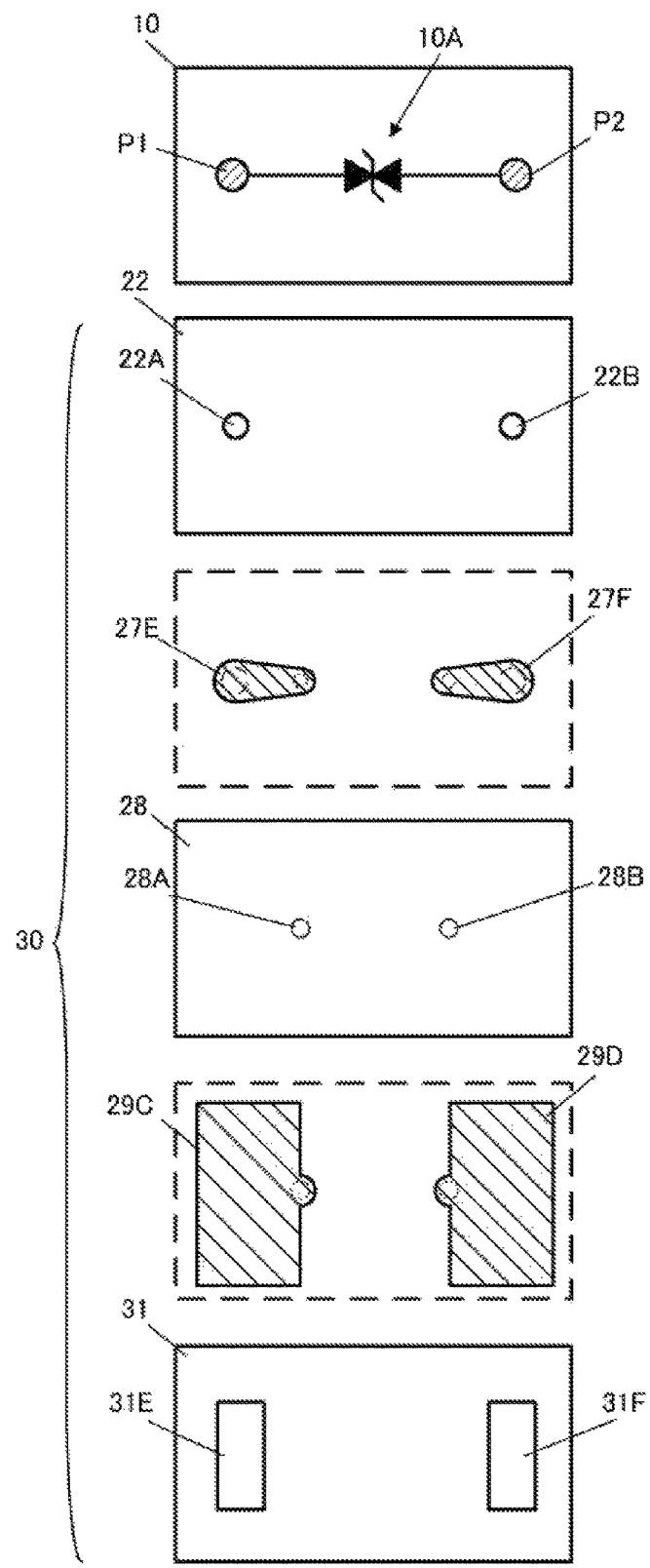
FIG. 17 is a diagram illustrating a modification example of the ESD protection device according to Embodiment 2.
Figure 18:
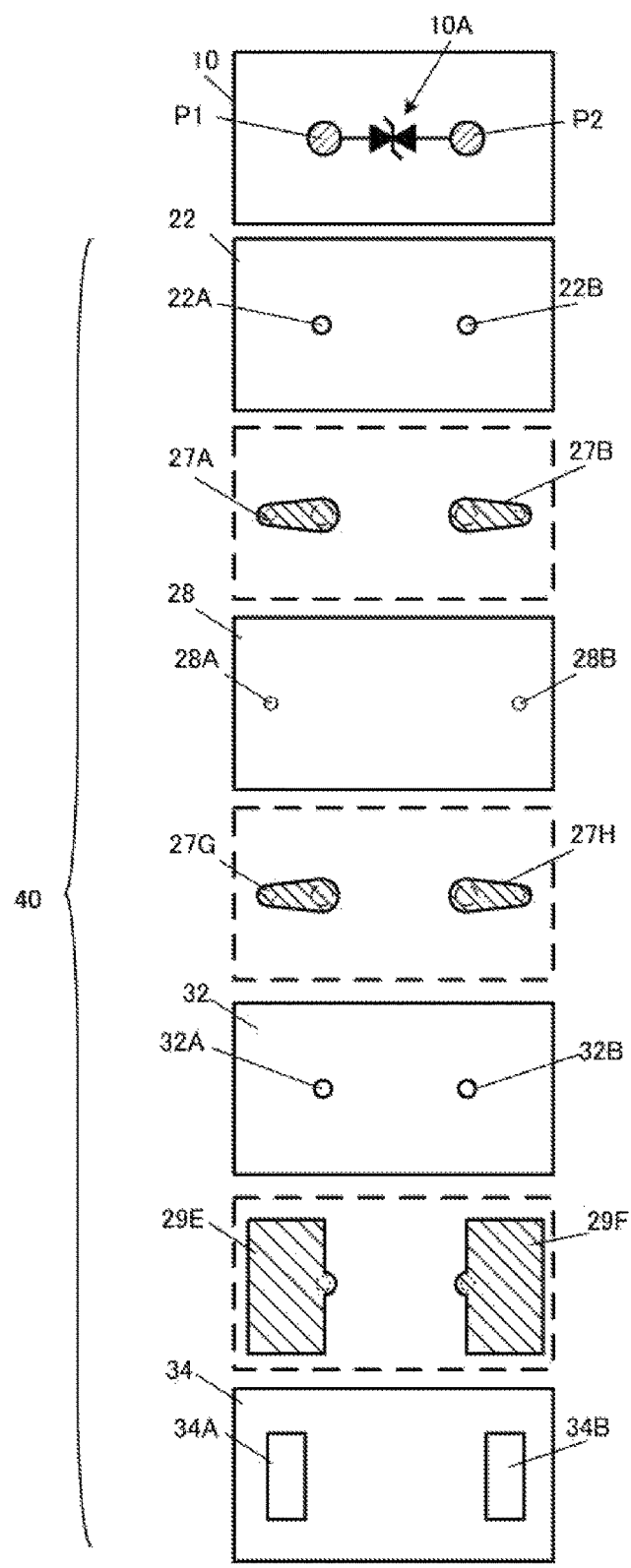
FIG. 18 is a diagram illustrating a modification example of the ESD protection device according to Embodiment 2.
Figure 19:
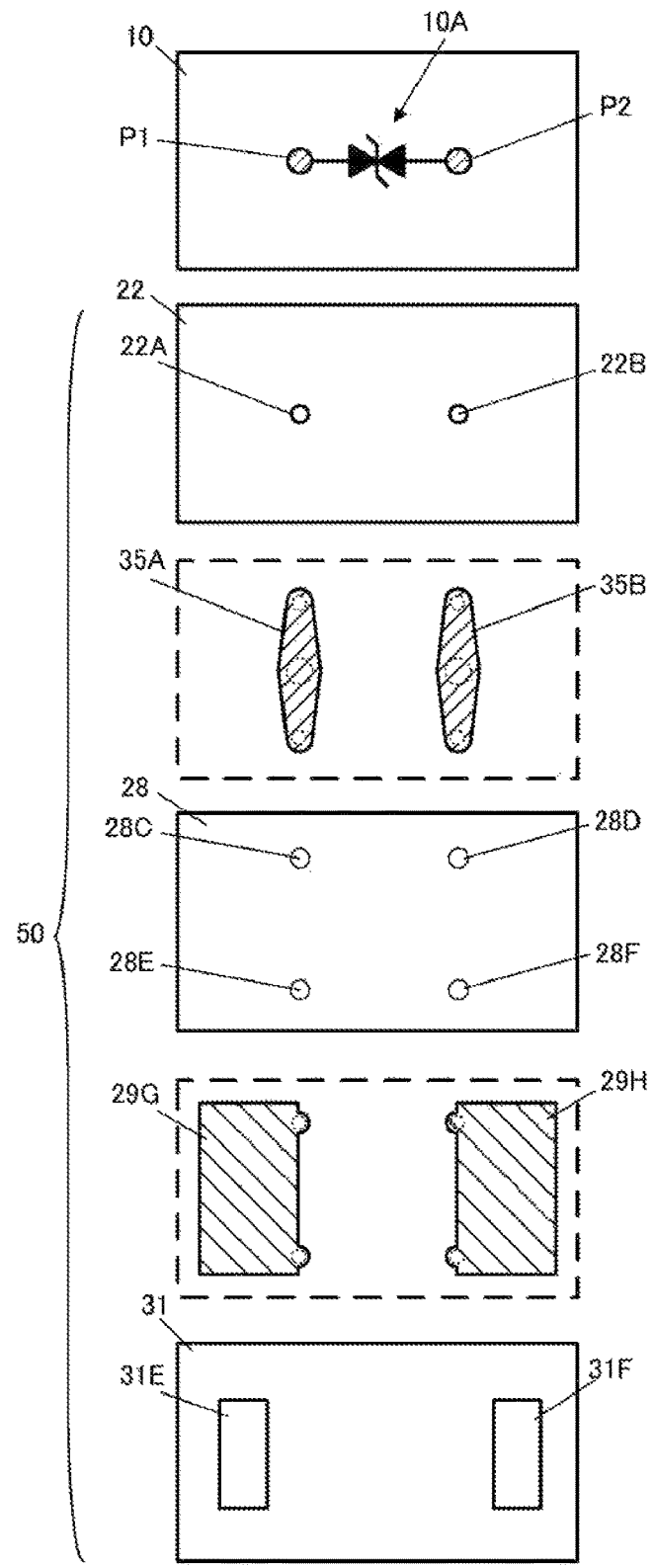
FIG. 19 is a diagram illustrating a modification example of the ESD protection device according to Embodiment 2.

Various modification examples of the ESD protection device 2 according to Embodiment 2 will be sequentially described below. FIGS. 17, 18, and 19 are diagrams illustrating respective modification examples of the ESD protection device according to Embodiment 2. FIGS. 17, 18, and 19 schematically show configurations for the ESD protection circuit 10A formed in the Si substrate 10.

The specific configurations are identical to the configuration shown in FIG. 2.

FIG. 17 shows an example in which the positional relationship between the contact holes and the via holes in the case of planar view is different from the case shown in FIG. 14. Intermediate wiring electrodes 27E, 27F have the same shapes as the intermediate wiring electrodes 27A, 27B, but widths reduced inward from outer edges of the ESD protection device. More specifically, the contact holes for the intermediate wiring electrodes 27E, 27F are formed to be inner with respect to the via holes for the terminal electrodes 29C, 29D. Further, parts of the resin layer 31, which are opposed to parts of the terminal electrodes 29C, 29D, have rectangular openings 31E and 31F formed.

FIG. 18 shows an example in which the number of resin layers of a rewiring layer 40 formed on the Si substrate 10 is increased from the case shown in FIG. 14. In this example, the rewiring layer 40 includes intermediate wiring electrodes 27G, 27H formed in the openings 28A, 28B of the resin layer 28 and on the surface thereof. The intermediate wiring electrodes 27G, 27H have the same shapes as the intermediate wiring electrodes 27A, 27B and have small width parts electrically connected to the intermediate wiring electrodes 27A, 27B.

Furthermore, the rewiring layer 40 includes a resin layer 32 formed on the resin layer 28. This resin layer 32 has openings 32A, 32B formed, and terminal electrodes 29E, 29F are formed in the openings 32A, 32B and on the surface of the resin layer 32. The terminal electrodes 29E, 29F have electrical connection to the intermediate wiring electrodes 27G, 27H. Furthermore, a resin layer 34 with openings 34A, 34B formed therein is further formed on the resin layer 32. The openings 34A, 34B are formed in positions opposed to parts of the terminal electrodes 29E, 29F.

FIG. 19 shows an example in which intermediate wiring electrodes have different shapes from the intermediate wiring electrodes 27A, 27B shown in FIG. 14. The rewiring layer 50 shown in this example includes intermediate wiring electrodes 35A, 35B. The intermediate wiring electrodes 35A, 35B are formed in the openings 22A, 22B of the resin layer 22 and on the surface of the resin layer 22. The intermediate wiring electrodes 35A, 35B have contact holes in central parts thereof, and electrical connection to the pads P1, P2. In addition, the intermediate wiring electrodes 35A, 35B have, at both ends thereof, small width parts.

The resin layer 28 formed on the resin layer 22 has four openings 28C, 28D, 28E, 28F formed. A terminal electrode 29G is formed in the openings 28C, 28E and on the surface of the resin layer 28, whereas a terminal electrode 29H is formed in the openings 28D, 28F and on the surface of the resin layer 28. Parts of the terminal electrodes 29G, 29H, which are formed in the openings 28C, 28D, 28E, 28F, have electrical connection to the intermediate wiring electrodes 35A, 35B.

The ESD protection devices in FIGS. 17 to 19 as described above also have, as in Embodiments 1 and 2, the SiN protection film 21 formed on the Si substrate 10, and the resin layer 22 lower in dielectric constant than the SiN protection film 21. For this reason, parasitic capacitance can be reduced which is generated between the Si substrate 10 and the intermediate wiring electrodes. Furthermore, the elimination of variation in the distance between the Si substrate 10 and the intermediate wiring electrodes can also suppress variation in parasitic capacitance generated. As a result, the shift in impedance can be reduced for high-frequency circuits provided with the ESD protection devices, and loss of signal can be reduced for the high-frequency circuits.

It is to be noted that the intermediate wiring electrodes 27E, 27F, 27G, 27H, 35A, 35B are formed by sputtering as Ti/Cu/Ti electrodes in FIGS. 17 to 19, as with the intermediate wiring electrodes 27A, 27B. In addition, the terminal electrodes 29C, 29D, 29E, 29F, 29G, 29H are different in shape from the terminal electrodes 29A, 29B, but formed from and by the same material and production method as the terminal electrodes 29A, 29B. The respective resin layers 31, 32, and 34 are formed by the same production methods as the resin layers 22, 26.

Furthermore, while the ESD protection devices including the zener diodes are described in the embodiments described above, the ESD protection devices are not limited to the embodiments, but may include, for example, a PNP-type semiconductor or an NPN-type semiconductor.

DESCRIPTION OF REFERENCE SYMBOLS 1,2 ESD protection device (semiconductor device)
10 Si substrate (semiconductor substrate)
10A ESD protection circuit
11,12,13 element forming region
20,30,40,50 rewiring layer
21 SiN protection film
22,26,28,31,32,34 resin layer
22A, 22B opening
23A, 23B Cu/Ti electrode
24A, 24B Au/Ni electrode
25A, 25B terminal electrode
26A, 26B opening
27A, 27B, 27C, 27D, 27E, 27F, 27G, 27H intermediate wiring electrode
28A, 28B, 28C, 28D, 28E, 28F opening
29A, 29B, 29C, 29D, 29E, 29F, 29G, 29H terminal electrode
31A, 31B, 31C, 31D, 31E, 31F opening
32A, 32B opening
34A, 34B opening
35A, 35B intermediate wiring electrode
D1, D2, D3, D4 diode (functional element)
Dz zener diode (functional element)
P1 port (metallic film)
P2 port (metallic film)

The invention claimed is:
1. A semiconductor device comprising:
a semiconductor substrate with a functional element formed thereon;
a metallic film disposed on a surface of the semiconductor substrate and electrically coupled to the functional element; and
a rewiring layer including:
a wiring electrode opposed to the surface of the semiconductor substrate,
a contact hole that electrically couples the metallic film and at least part of the wiring electrode,
a protection film layer disposed on the surface of the semiconductor substrate to cover a portion of the metallic film in a region other than a region where the metallic film is in contact with the contact hole and the surface of the semiconductor substrate, and
a resin layer having a lower dielectric constant than the protection film layer and disposed between the protection film layer and the wiring electrode to cover the protection film layer,
wherein the protection film layer has a cross-sectional shape that increases in thickness as the protection film layer extends away from the contact hole along the surface of the semiconductor substrate in an area in which the protection film layer opposes the wiring electrode,
wherein the resin layer has a cross-sectional shape that decreases in thickness as the protection film layer increases in thickness when the protection film layer extends away from the contact hole, and wherein the wiring electrode has a shape that decreases in width in a direction of the wiring electrode extending away from a region where the wiring electrode contacts the contact hole along the surface of the semiconductor substrate in plan view.

2. The semiconductor device according to claim 1, wherein the protection film layer has a higher permittivity than the resin layer.

3. The semiconductor device according to claim 1, wherein the wiring electrode comprises a pair of electrodes formed by Cu/TI and Au/Ni.

4. The semiconductor device according to claim 1, wherein the wiring electrode comprises an L-shape with an end extending over the contact hole.

5. The semiconductor device according to claim 1, wherein the rewiring layer further includes at least one additional resin layer with at least one additional contact hole and at least one intermediate electrode disposed therein an electrically connected to the wiring electrode.

6. The semiconductor device according to claim 2, wherein the protection film layer has a relative permittivity of 7 to 8.

7. The semiconductor device according to claim 6, wherein the resin has a relative permittivity of 2 to 6.

8. The semiconductor device according to claim 5, wherein the at least one additional contact hole does not overlap the contact hole in a planar view of the semiconductor device.

9. The semiconductor device according to claim 5, wherein the at least one intermediate electrode comprises a shape that decreases in width with increasing distance from the metallic film in a planar view of the semiconductor device.

10. An ESD protection device comprising:
a semiconductor substrate including a plurality of diodes for ESD protection disposed thereon;
a first electrode connected to a first end of one of the plurality of diodes that is disposed on the surface of the semiconductor substrate;
a second electrode disposed on the surface of the semiconductor substrate and connected to a second end of the one of the plurality of diodes; and
a rewiring layer including:
  a wiring electrode opposed to the surface of the semiconductor substrate,
  a contact hole that electrically couples the first electrode and at least part of the wiring electrode,
  a protection film layer disposed on the surface of the semiconductor substrate to cover a portion of the first electrode in a region other than a region where the first electrode is in contact with the contact hole and the surface of the semiconductor substrate, and
  a resin layer having a lower dielectric constant than the protection film layer and disposed between the protection film layer and the wiring electrode to cover the protection film layer,
wherein the wiring electrode overlaps both the first electrode and the second electrode,
wherein the protection film layer has a cross-sectional shape that increases in thickness as the protection film layer extends away from the contact hole along the surface of the semiconductor substrate in an area in which the protection film layer opposes the wiring electrode,
wherein the resin layer has a cross-sectional shape that decreases in thickness as the protection film layer increases in thickness when the protection film layer extends away from the contact hole, and
wherein the wiring electrode has a shape that decreases in width in a direction of the wiring electrode extending away from a region where the wiring electrode contacts the contact hole along the surface of the semiconductor substrate in plan view.

11. The semiconductor device according to claim 10, wherein the protection film layer has a higher permittivity than the resin layer.

12. The semiconductor device according to claim 10, wherein the wiring electrode comprises a pair of electrodes formed by Cu/TI and Au/Ni.

13. The semiconductor device according to claim 10, wherein the wiring electrode comprises an L-shape with an end extending over the contact hole.

14. The semiconductor device according to claim 10, wherein the rewiring layer further includes at least one additional resin layer with at least one additional contact hole and at least one intermediate electrode disposed therein an electrically connected to the wiring electrode.

15. The semiconductor device according to claim 11, wherein the protection film layer has a relative permittivity of 7 to 8.

16. The semiconductor device according to claim 15, wherein the resin has a relative permittivity of 2 to 6.

17. The semiconductor device according to claim 14, wherein the at least one additional contact hole does not overlap the contact hole in a planar view of the semiconductor device.

18. The semiconductor device according to claim 14, wherein the at least one intermediate electrode comprises a shape that decreases in width with increasing distance from the metallic film in a planar view of the semiconductor device.

* * * * *